United States Patent [19]

Araki et al.

[11] Patent Number: 5,510,172
[45] Date of Patent: Apr. 23, 1996

[54] MAGNETIC MULTILAYER FILM AND MAGNETORESISTANCE ELEMENT

[75] Inventors: Satoru Araki; Daisuke Miyauchi, both of Chiba, Japan

[73] Assignee: TDK Corporation, Tokyo, Japan

[21] Appl. No.: 79,940

[22] Filed: Jun. 23, 1993

[30] Foreign Application Priority Data

Jun. 23, 1992 [JP] Japan ..................................... 4-188840

[51] Int. Cl.$^6$ ............................... B32B 7/02; G11B 5/66; G11B 5/70; G11B 5/127
[52] U.S. Cl. .......................... 428/213; 324/252; 360/110; 360/113; 428/694 R; 428/694 T; 428/694 TM; 428/900
[58] Field of Search ................................. 428/693, 694 T, 428/694 TM, 694 R, 655, 668, 680, 681, 216, 611; 360/110, 113; 324/252

[56] References Cited

FOREIGN PATENT DOCUMENTS

| 0483373 | 5/1992 | European Pat. Off. . |
| 0498344 | 8/1992 | European Pat. Off. . |
| 4-339309 | 11/1992 | Japan . |

OTHER PUBLICATIONS

Proceedings of Magnetics Research Meeting of Japanese Electrical Society, MAG-91-161, Hoshino, et al., pp. 65-71.

Phys. Rev. Lett., vol. 61, p. 2472, 1988.

*Primary Examiner*—Paul J. Thibodeau
*Assistant Examiner*—Stephen Sand
*Attorney, Agent, or Firm*—Oblon, Spivak, McClelland, Maier & Neustadt

[57] ABSTRACT

A magnetic multilayer film having magnetoresistance (MR) is prepared by depositing at least two magnetic thin films having different coercive forces while interposing a non-magnetic thin film therebetween. A first magnetic thin film having a lower coercive force has a squareness ratio $SQ_1$ and a thickness $t_1$, a second magnetic thin film having a higher coercive force has a squareness ratio $SQ_2$ and a thickness $t_2$, and the non-magnetic thin film has a thickness $t_3$. A first form of the invention requires 4 Å$\leq t_2 <$30 Å, 20 Å$< t_1 \leq$200 Å, $t_1 > t_2$, $t_3 \leq$200 Å, $0.7 \leq SQ_1 \leq 1.0$, and $0.1 \leq SQ_2 \leq 0.8$, thereby achieving a magnetic multilayer film which shows a great MR ratio of several percents under an external magnetic field of several Oe, an excellent rise across zero magnetic field and heat resistance. A second form of the invention requires 4 Å$< t_2 <$20 Å, 5 Å$< t_1 \leq$20 Å, $t_1 < t_2$ and 32 Å$< t_3 <$50 Å, thereby achieving a magnetic multilayer film which is increased in MR ratio, MR slope between −50 Oe and +50 Oe, and high-frequency MR slope while showing minimized hysteresis. There are obtained MR elements, typically high sensitivity MR sensors and MR heads capable of high density magnetic recording.

20 Claims, 9 Drawing Sheets

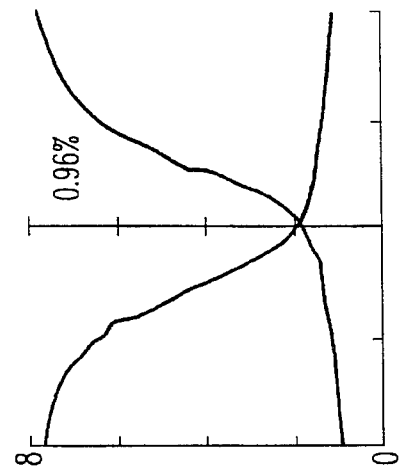
FIG. 6A  FIG. 6B
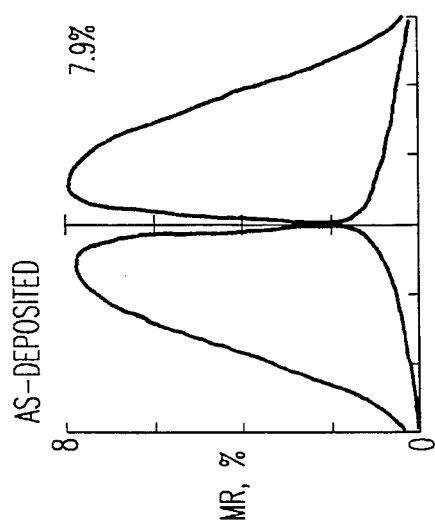
FIG. 6C  FIG. 6D
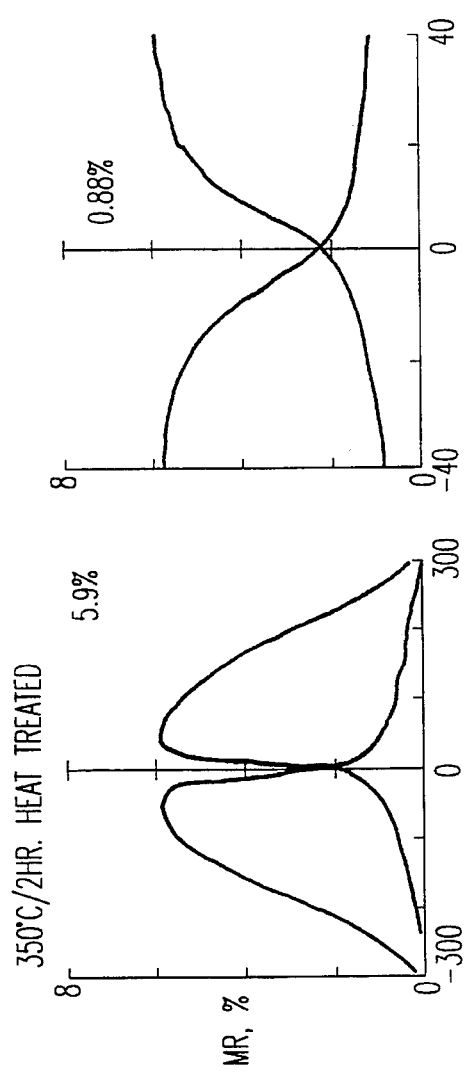

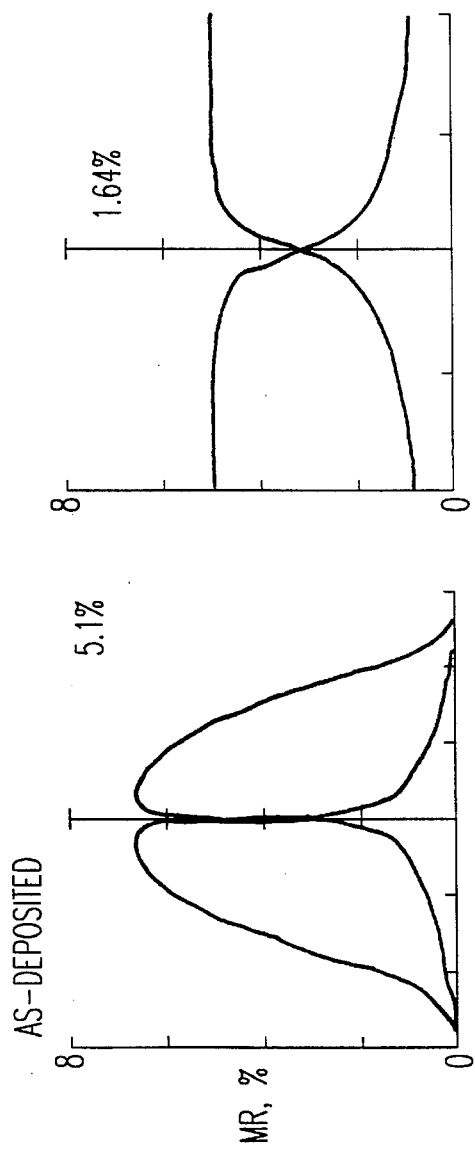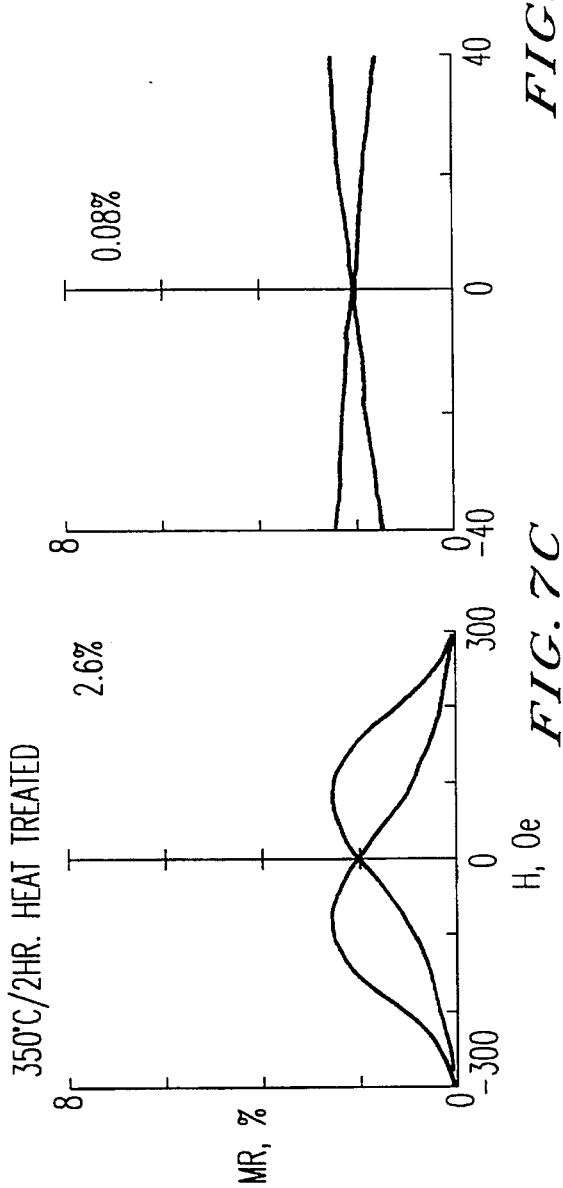

MAGNETIC MULTILAYER FILM AND MAGNETORESISTANCE ELEMENT

BACKGROUND OF THE INVENTION

1. Field of the Invention

This invention relates to a magnetoresistance element for reading the magnetic field intensity of magnetic recording media as signals, especially a magnetoresistance element capable of reading a small magnetic field change as a greater electrical resistance change signal and a magnetic multilayer film suitable for use therein. The term "magnetoresistance" is often abbreviated as MR, hereinafter.

2. Prior Art

There are growing demands for increasing the sensitivity of magnetic sensors and increasing the density of magnetic recording. Active research works have been devoted for the development of magnetoresistance effect type magnetic sensors (simply referred to as MR sensors, hereinafter) and magnetoresistance effect type magnetic heads (simply referred to as MR heads, hereinafter). Both MR sensors and MR heads are designed to read out external magnetic field signals by detecting changes in the resistance of a reading sensor portion formed of magnetic material. The MR sensors have the advantage of high sensitivity and the MR heads have the advantage of high outputs in high density magnetic recording since the reproduced output does not depend on the relative speed of the sensors or heads to the recording medium.

Conventional MR sensors of magnetic materials such as $Ni_{0.8}Fe_{0.2}$ (Permalloy) and NiCo utilizing anisotropic magnetoresistance effect offer only an MR ratio $\Delta R/R$ as small as 2 to 4% and are short in sensitivity as reading MR heads adapted to accommodate for ultrahigh density recording of the order of several GBPI.

Attention is now paid to artificial superlattices having the structure in which thin films of metal having a thickness of an atomic diameter order are periodically stacked since their behavior is different from bulk metal. One of such artificial superlattices is a magnetic multilayer film having ferromagnetic metal thin films and antiferromagnetic metal thin films alternately deposited on a substrate. Heretofore known are magnetic multilayer films of iron-chromium, nickel-chromium and iron-manganese types as disclosed in Japanese Patent Application Kokai (JP-A) No. 189906/1985. Among them, the iron-chromium (Fe/Cr) type was reported to exhibit a magnetoresistance change in excess of 40% at cryogenic temperature (4.2K) (see Phys. Rev. Lett., Vol. 61, page 2472, 1988). This artificial superlattice magnetic multilayer film, however, is not commercially applicable as such because the external magnetic field at which a maximum resistance change occurs (that is, operating magnetic field intensity) is as high as ten to several tens of kilooersted (kOe). Additionally, there have been proposed artificial superlattice magnetic multilayer films of Co/Cu and Co/Ag, which require too high operating magnetic field intensity.

Under these circumstances, a three-element magnetic multilayer film having two magnetic layers having different coercive forces deposited through a non-magnetic layer was proposed as exhibiting a giant MR change due to induced ferrimagnetism. For example, European Patent Application No. 0483 373 proposed such a magnetic multilayer film in which two magnetic layers disposed adjacent to each other through a non-magnetic layer have different coercive forces (Hc) and a thickness of up to 200 Å. Also the following reports are known.

(a) T. Shinjo and H. Yamamoto, the Journal of the Physical Society of Japan, Vol. 59 (1990), page 3061

[Co(30)/Cu(50)/NiFe(30)/Cu(50)]×15 wherein the number in the parentheses represents the thickness in angstrom of the associated layer and the number after "x" is the number of repetition (the same applies hereinafter) produced an MR ratio of 9.9% at an applied magnetic field of 3000 Oe and about 8.5% at 500 Oe.

(b) H. Yamamoto, Y. Okuyama, H. Dohnomae and T. Shinjo, the Journal of Magnetism and Magnetic Materials, Vol. 99 (1991), page 243

In addition to (a), this article discusses the results of structural analysis, changes with temperature of MR change and resistivity, changes with the angle of external magnetic field, a minor loop of MR curve, dependency on stacking number, dependency on Cu layer thickness, and changes of magnetization curve.

(c) EP-A1 0483 373/1991

Disclosed is a magnetic multilayer film having two magnetic thin films having different coercive forces stacked through an intervening non-magnetic thin film. An exemplary structure includes a Ni—Fe film of 25 Å or 30 Å thick, an intervening Cu film, and a Co film of 25 Å or 30 Å thick.

(d) EP-A1 0498 344/1992

Disclosed is a magnetic multilayer film having stacked through an intervening non-magnetic thin film two magnetic thin films of $(Ni_xCo_{1-x})x'^{Fe}1-x'$ and $(Co_yNi_{1-y})z^{Fe}1-z$ wherein x=0.6–1.0, x'=0.7–1.0, y=0.4–1.0, and z=0.8–1.0. An exemplary structure includes a non-magnetic thin film of 50 Å thick intervening between two magnetic thin films of 30 Å thick.

(e) Hoshino, Hosoe, Jinpo, Kanda, Tsunashima and Uchiyama, Proceedings of Magnetics Research Meeting of the Japanese Electrical Society, MAG-91-161

This is a confirmation test of (a) and (b). Included are tests of dependency on Cu layer thickness and dependency on NiFe layer thickness. Also reported is the result about the dependency of coercivity of Co on Cu layer thickness which is simulatively determined from the magnetization curve by extrapolation. Magnetization curves are derived from NiFe(30)-Cu(320) and Co(30)-Cu(320) and synthesized for comparison with a magnetization curve of NiFe(30)-Cu(160)-Co(30)-Cu(160). Since the thickness of the Cu intermediate layer is different from that of a three-element multilayer, direct comparison of squareness ratio and coercivity is impossible.

FIGS. 7 and 8 of this article show the dependency on NiFe layer thickness $t_1$ and Co layer thickness $t_2$ with the non-magnetic an MR ratio available when the NiFe layer thickness $t_1$ is varied from 5 Å to 50 Å with the Co layer thickness $t_2$ fixed at 30 Å. Plotted in FIG. 8 are data at coordinates ($t_1$, $t_2$)=(20, 10) and (20, 5). All these data show MR ratios below 4%.

(f) Okuyama, Yamamoto and Shinjo, Proceedings of Magnetics Research Meeting of the Japanese Electrical Society, MAG-91-242

This article describes the phenomenological analysis on giant MR changes by induced ferrimagnetism. With the rotation of magnetic moment of an NiFe layer with low Hc, MR similarly changes. A giant MR phenomenon develops due to the artificially created spin anti-parallelism. It is proven by a difference in MR by an angular change of the applied magnetic field that this phenomenon is different from the anisotropic MR effect of NiFe or the like.

(g) Miyauchi, Araki and Narumiya, the Journal of Japanese Applied Magnetics Society, vol. 17, page 365–368, Apr. 1, 1993

This article of ours was published after the filing date in Japan of the basic application, but before the filing date of this application in the U.S. It relates to a three-element system magnetic multilayer film using NiFe and Co. FIG. 8 of this article shows an MR curve of Cr(50)[Cu(50)-Co(10)-Cu(50)NiFe(10)]×10 over the magnetic filed range between −10 Oe and +10 Oe. Plotted in FIG. 7 of this article are data at coordinates $(t_1, t_2)=(10, 10), (20, 10), (30, 10), (30, 15),$ and $(20, 20)$ wherein $t_1$ is a NiFe thickness and $t_2$ is a Co thickness. Also plotted in FIG. 3 of this article are data representative of an MR slope at coordinates $(t_1, t_2) =(10, 10), (15, 10), (20, 10),$ and $(30, 10)$. In all samples, the Cu layer has a thickness of 50 Å.

As mentioned above, three-element magnetic multilayer films exhibit a giant MR ratio of about 10% under an applied magnetic field of up to about several hundreds of oersted, though the magnitude of MR ratio is small as compared with Fe/Cr, Co/Cu and Co/Ag. It is to be noted that these disclosures refer to only MR changes under an applied magnetic field of up to about 10 to 100 Oe.

For practical MR head material to find use in ultra-high density magnetic recording, an MR curve under an applied magnetic field of 0 to about 40 or 50 Oe is critical. The above-mentioned prior art three-element artificial superlattices, however, failed to increase MR changes under zero magnetic field, with an MR change approximate to 0. An increase of MR change becomes maximum at about 60 Oe and an MR ratio of about 9% is then obtained. This implies that the MR curve has a slow rise. In the case of Permalloy (NiFe), the MR change has a gradient of approximately 0 across zero magnetic field and the MR ratio remains substantially unchanged, with a differential value of MR ratio being close to 0.

For overcoming such properties, NiFe is provided with a shunt layer having low resistivity such as Ti for providing a shift of the operating point. In addition to the shunt layer, a soft film bias layer of soft magnetic material having a high resistivity such as CoZrMo and NiFeRh is provided for applying a bias magnetic field. The structure having such a bias layer, however, is complex in steps, difficult to provide stable properties, and increased in cost. It also invites a lowering of S/N since it uses a relatively moderate portion of the MR curve.

Moreover, MR heads have a complex layered structure, require heat treatment such as baking and curing of resist material during patterning and flattening steps, and must tolerate temperatures of about 250° to 350° C. Conventional three-element artificial superlattice magnetic multilayer films, however, degrade their properties during such heat treatment.

Also, the prior art three-element system magnetic multilayer films have unsatisfactory properties since their MR slope does not exceed 0.15% /0e over the magnetic field range between −50 and +50 Oe. The only exception is our article (g) referred to above which reports in FIG. 8, a linear MR change over the magnetic field range between −10 Oe and +10 Oe.

Further, it is of importance for MR heads to show an MR curve having a reduced maximum hysteresis width. Although a maximum hysteresis width of 10 Oe or less is recommended in practice, most prior art three-element magnetic multilayer films fail to meet the requirement. The only exception is our article (g) referred to above which reports in FIG. 8, a noticeably reduced hysteresis width.

Often MR heads are used in a magnetic field with a high frequency of 1 MHz or higher for reproduction of high density magnetic recorded signals. Most prior art three-element magnetic multilayer films are difficult to produce an MR slope of 0.03%/Oe or more in a magnetic field with a 1-MHz or higher frequency partly because of their film thickness combination.

SUMMARY OF INVENTION

An object of the present invention is to provide a novel and improved magnetic multilayer film exhibiting a linear rise of MR change under an applied magnetic field within a very narrow range of 0 to about 40 Oe, for example, and having high heat resistance. Another object is to provide a magneto-resistance element using the same.

A further object is to provide a magnetic multilayer film which features a reduced maximum hysteresis width, for example, of up to 10 Oe, a great MR slope, for example, of at least 0.15%/Oe over the magnetic field range between −50 Oe and +50 Oe, a great MR ratio, for example, of at least 5%, a great high-frequency MR slope, for example, of at least 0.03%/0e in a magnetic field with a high frequency of 1 MHz or higher, and good heat tolerance. A still further object is to provide a magnetoresistance element using the same.

According to the present invention, a magnetic multilayer film includes at least two magnetic thin films stacked through an intervening non-magnetic thin film. The magnetic thin films adjoin each other through the non-magnetic thin film and have different coercive forces. A first magnetic thin film having a lower coercive force has a thickness $t_1$ and a squareness ratio $SQ_1$, a second magnetic thin film having a higher coercive force has a thickness $t_2$ and a squareness ratio $SQ_2$, and the non-magnetic thin film has a thickness $t_3$.

According to a first aspect of the present invention, the film thicknesses $t_1$, $t_2$ and $t_3$ are controlled to fall in the range: $4 Å \leq t_2 < 30 Å$, $20 Å < t_1 > 200 Å$, $t_1 > t_2$, and $t_3 \leq 200 Å$, preferably in the range: $4 Å \leq t_2 < 28 Å \leq t_1$, and $t_1 \geq 1.05 t_2$. The first magnetic thin film's squareness ratio $SQ_1$ is from 0.7 to 1.0 and the second magnetic thin film's squareness ratio $SQ_2$ is from 0.1 to 0.8. Preferably, $SQ_2/SQ_1$ is from 0.3 to 1.0 .

A magnetic multilayer film as defined above is prepared by depositing at least two magnetic thin films, optionally on a substrate, while interposing a non-magnetic thin film therebetween and effecting heat treatment at a temperature of up to 500° C.

There is also provided a magnetoresistance element comprising a magnetic multilayer film as defined above on a substrate. Such a magnetoresistance element is prepared by depositing at least two magnetic thin films on a substrate while interposing a non-magnetic thin film therebetween and effecting heat treatment at a temperature of up to 500° C., thereby forming a magnetic multilayer film as defined above on the substrate.

According to a second aspect of the present invention, the film thicknesses $t_1$, $t_2$ and $t_3$ are controlled to fall in the range: $4 Å < t_2 < 20 Å$, $5 Å < t_1 20 Å$, $t_1 > t_2$, and $32 Å < t_3 < 50 Å$, preferably in the range: $6 Å \leq t_2$, $t_1 \leq 18 Å$, $t_1 < 1.05 t_2$, and $36 Å \leq t_3 \leq 48 Å$. Preferably, the first magnetic thin film's squareness ratio $SQ_1$ is from 0.7 to 1.0 and the second magnetic thin film's squareness ratio $SQ_2$ is from 0.1 to 0.8, especially with $SQ_2/SQ_1$ ranging from 0.3 to 1.0.

A magnetic multilayer film as defined above is prepared by depositing at least two magnetic thin films, optionally on a substrate, while interposing a non-magnetic thin film therebetween and effecting heat treatment at a temperature of up to 400° C.

There is also provided a magnetoresistance element comprising a magnetic multilayer film as defined above on a substrate. Such a magnetoresistance element is prepared by depositing at least two magnetic thin films on a substrate while interposing a non-magnetic thin film therebetween and effecting heat treatment at a temperature of up to 400° C., thereby forming a magnetic multilayer film as defined above on the substrate.

ADVANTAGES

In order that a three-element magnetic multilayer film possess an MR curve having good linearity across zero magnetic field, a steep MR slope and improved heat resistance, only a difference in coercive force (Hc) as described in the above-cited references (a) to (f) is insufficient. The squareness ratio and thickness of first and second magnetic thin films must be restricted in accordance with the first aspect of the invention before such a favorable rise and heat resistance can be established. The squareness ratio and relative thickness of first and second magnetic thin films are not taught in the above-cited references (a) to (f) and our preceding application.

In order that a three-element magnetic multilayer film show an MR curve having a fully linear, great gradient over the magnetic field range between −50 Oe and +50 Oe, a reduced hysteresis width, a high MR ratio, a great MR slope in a magnetic field with a high frequency of 1 MHz, and good heat resistance, only a difference in coercive force as described in the above-cited references (a) to (g) is insufficient. To satisfy all these requirements, the thicknesses of first and second magnetic thin films and a non-magnetic thin film should be restricted as specified above in the second aspect. Such relative film thickness control is not taught in the above-cited references (a) to (g) and our preceding application.

BRIEF DESCRIPTION OF THE DRAWINGS

FIG. 6 shows MR curves of as-deposited and heat treated sample No. 3.

FIG. 7 shows MR curves of as-deposited and heat treated comparative sample No. 7.

DETAILED DESCRIPTION OF THE INVENTION

Figure 2:
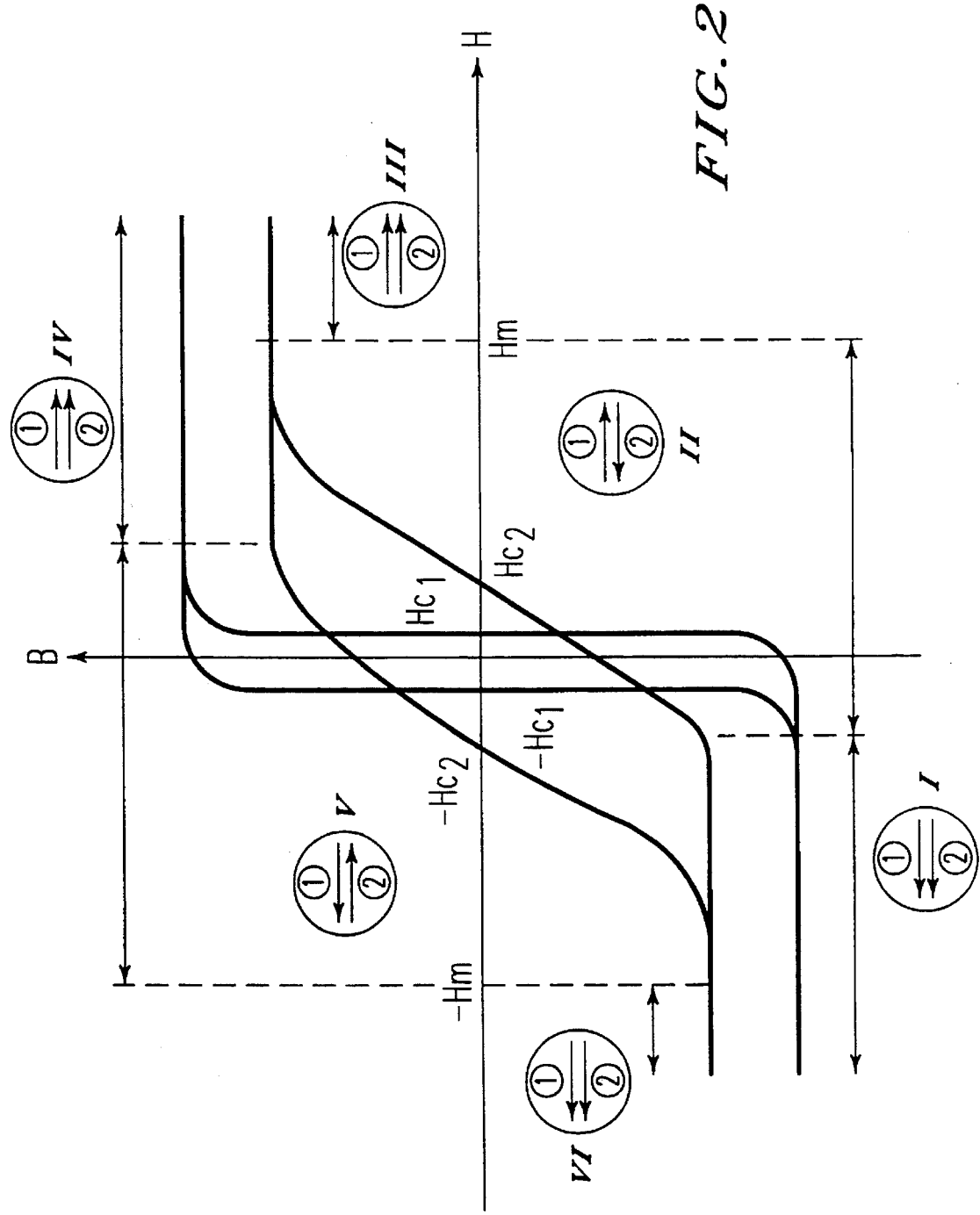
FIG. 2 is a diagram showing exemplary B-H curves for explaining the principle of the invention.

According to the present invention, first and second magnetic thin films which are disposed adjacent to each other through a non-magnetic thin film must have different coercive forces. This is because the principle of the invention is that conducting electrons are subject to spin-dependent scattering to increase resistance as adjacent magnetic layers are offset in the direction of magnetization, and the resistance reaches maximum when the adjacent magnetic layers have opposite directions of magnetization. More particularly, when an external magnetic field is intermediate the coercive force $Hc_1$ of the first magnetic thin film and the coercive force $Hc_2$ of the second magnetic thin film ($Hc_1 < H < Hc_2$) as shown in FIG. 2, the adjacent magnetic layers will have opposite components in their magnetization direction, resulting in an increased resistance.

Now, the external magnetic field, coercive force and magnetization direction of a three-element artificial superlattice magnetic multilayer film are described.

Figure 1:
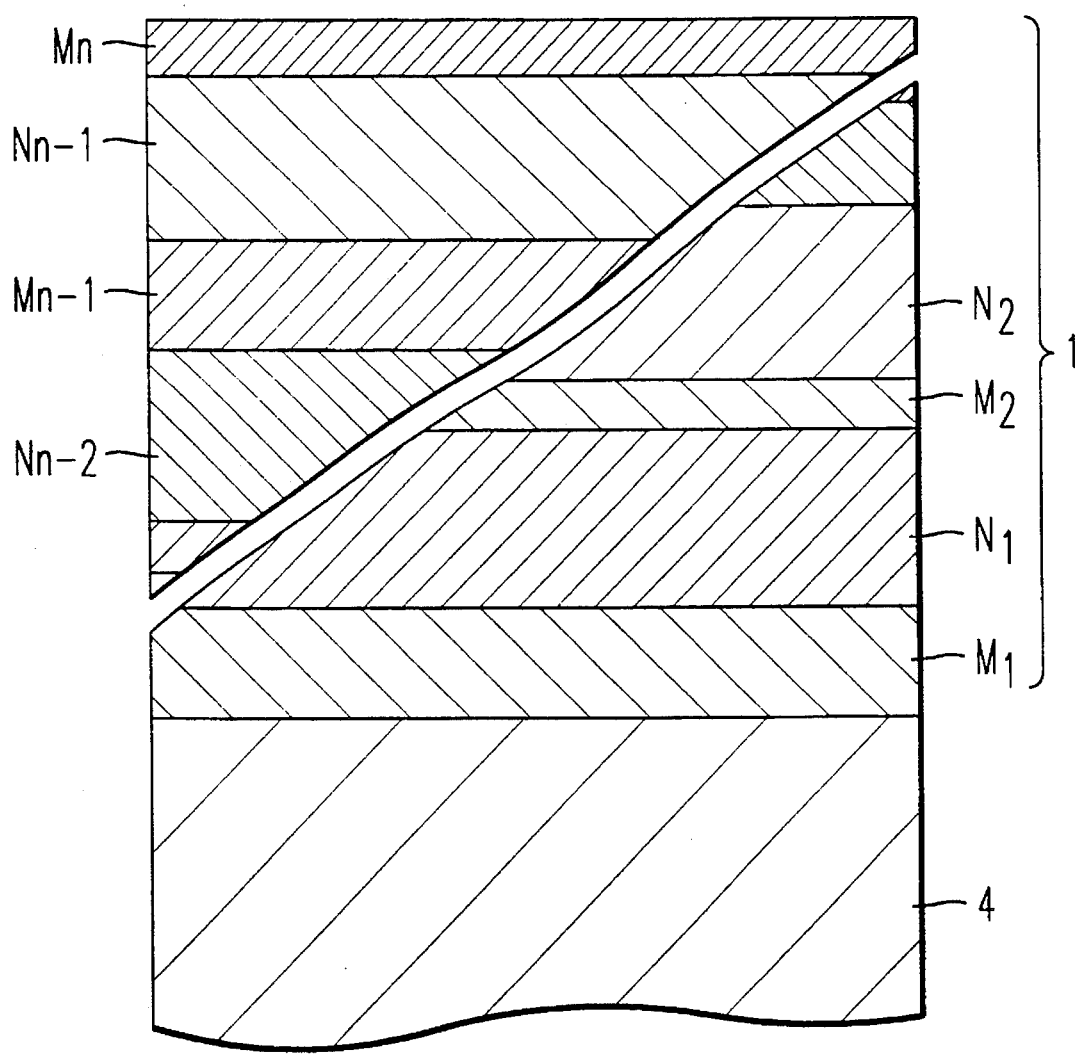
FIG. 1 is a fragmental cross section of a magnetic multilayer film according to the invention.

Referring to FIG. 1, there is shown in cross section an artificial superlattice magnetic multilayer film 1 according to one embodiment of the invention. The magnetic multilayer film 1 includes magnetic thin films $M_1, M_2, \ldots, M_{n-1}$, and $M_n$ on a substrate 4 and non-magnetic thin films $N_1, N_2, \ldots, N_{n-2}$, and $N_{n-1}$ each between a pair of two adjacent magnetic thin films.

For the sake of brevity of description only, reference is made to the embodiment having only two types of magnetic thin films having different coercive forces. As shown in FIG. 2, the two types of magnetic thin films (1) and (2) have different coercive forces $Hc_1$ and $Hc_2$, respectively ($0 < Hc_1 < Hc_2$). At the initial, an external magnetic field H is applied wherein $H < Hm$, provided that Hm is the external magnetic field under which the magnetization of the second magnetic thin film (2) is saturated. The first and second magnetic thin films (1) and (2) have magnetization directions oriented in a negative (−) direction same as H. Then the external magnetic field is increased to region I of $H < Hc_1$ where both the magnetic thin films have magnetization directions oriented in one direction. As the external magnetic field is increased to region II of $Hc_1 < H < Hm$, part of the magnetic thin film (1) starts reversing its magnetization direction so that the magnetization directions of magnetic thin films (1) and (2) may include opposite components. When the external magnetic field is further increased to region III of $Hm < H$, the magnetic thin films (1) and (2) have magnetization directions aligned in a positive (+) direction.

Now, the external magnetic field H is reduced. In region IV of $+Hc_2 < H$, the magnetic thin films (1) and (2) have magnetization directions still aligned in a positive (+) direction. In region V of $-Hc_2 < H < +Hc_2$, the magnetic thin film (1) starts reversing its magnetization direction in one direction so that the magnetization directions of magnetic thin films (1) and (2) may include opposite components. Subsequent in region VI of $H < -Hm$, the magnetic thin films (1) and (2) have magnetization directions aligned in one direction again.

In the regions II and V where the magnetic thin films (1) and (2) have opposite magnetization directions, conducting electrons are subject to spin-dependent scattering, resulting in an increased resistance. By selecting a low Hc material such as $Ni_{0.8}Fe_{0.2}$ (Hc=several Oe) as the first magnetic thin film (1) and a somewhat high Hc material such as Co (Hc=several tens of Oe) as the second magnetic thin film (2), for example, there is obtained an MR element exhibiting a great MR ratio at a low external magnetic field approximate to external magnetic field $Hc_2$.

The magnetic materials of which the magnetic thin films are formed herein are not critical although they are preferably selected from Fe, Ni, Co, Mn, Cr, Dy, Er, Nd, Tb, Tm, Ce and Gd. Also useful are alloys and compounds containing these elements, for example, Fe—Si, Fe—Ni, Fe—Co, Fe—Al, Fe—Al—Si (Sendust, etc.), Fe—Y, Fe—Gd, Fe—Mn, Co—Ni, Cr—Sb, Fe system amorphous alloys, Co system amorphous alloys, Co—Pt, Fe—C, Mn—Sb, Ni—Mn, Co—O, Ni—O, Fe—O, Fe—Al—Si—N, Ni—F, and ferrite. In the practice of the invention, two or more materials having different coercive forces are selected from the foregoing materials to form the magnetic thin films.

In the first form of the invention, the magnetic thin films have a thickness of up to 200 Å. The lower limit of the magnetic thin film thickness is 4 Å below which the films have a Curie point lower than room temperature and lose practical value. A thickness of 4 Å or more facilitates to form a film of uniform thickness and of quality and avoids an excess reduction of the magnitude of saturation magnetization.

In both the first and second forms of the invention, the respective magnetic thin films have coercive forces Hc which may be suitably selected in the range of, for example, 0.001 Oe to 10 kOe, especially 0.01 to 1000 Oe, depending on the intensity of an applied external magnetic field and the MR ratio required for the element associated therewith. The ratio in coercive force between adjacent magnetic thin films is preferably from 1.2:1 to 100:1, especially from 1.5:1 to 100:1, more preferably from 2:1 to 80:1, especially from 3:1 to 60:1, most preferably from 5:1 to 50:1, especially from 6:1 to 30:1. Outside the range, a higher ratio would result in a broader MR curve whereas a lower ratio leads to a close difference between coercive forces, failing to take advantage of anti-parallelism.

Coercive force Hc is measured as follows because it is impossible to direct₁ measure the magnetic properties of magnetic thin films in a magnetoresistance effect element. Magnetic thin films to be measured for Hc are deposited by evaporation alternately with non-magnetic thin films until the total thickness of the magnetic thin films reaches about 200 to 400 Å. The resulting sample is measured for magnetic properties. It is to be noted that the thickness of magnetic thin films, the thickness of non-magnetic thin films, and the composition of non-magnetic thin films are the same as in a magnetoresistance effect element to be examined.

In order to provide an MR curve having good linearity across zero magnetic field and improved heat resistance, the first magnetic thin film having lower Hc and the second magnetic thin film having higher Hc must have controlled residual magnetization Mr at zero magnetic field, that is, controlled squareness ratio SQ=Mr/Ms. The first magnetic thin film should preferably have a squareness ratio $SQ_1$ of $0.7 \leq SQ_1 < 1.0$, more preferably $0.8 \leq SQ_1 \leq 1.0$. The second magnetic thin film should preferably have a squareness ratio $SQ_2$ of $0.1 \leq SQ_2 \leq 0.8$, more preferably $0.3 \leq SQ_2 \leq 0.8$. For the first magnetic thin film, a squareness ratio $SQ_1$ as close as to 1.0 is preferred because a rise of MR change in proximity to zero magnetic field is of concern. With $SQ_1$ smaller than 0.7, the MR curve will have a broader rise, resulting in a smaller MR ratio.

For the second magnetic thin film, it is preferred that magnetization near zero magnetic field be smaller than the residual magnetization (Mr). With a squareness ratio of 0.7, while the first and second magnetic thin films have magnetization aligned in one direction, but 30% of the second magnetic thin film will reverse its magnetization direction under zero magnetic field. As a consequence, there is locally created a region exhibiting anti-parallelism under zero magnetic field, yielding an MR change dependent on the spin associated therewith. Therefore, a proper choice of the squareness ratio of the second magnetic thin film allows for free design of an MR curve which varies linearly under zero magnetic field.

For magnetic thin fills satisfying these properties, preferably the first magnetic thin film has a composition: $(Ni_xFe_{1-x})y^{Co}{}_{1-w}$ wherein letters x and w are $0.7 \leq x \leq 0.9$ and $0.5 \leq y \leq 1.0$ and the second magnetic thin film has a composition: $(Co_zNi_{1-z})w^{Fe}{}_{1-w}$ wherein letters z and w are $0.4 \leq z \leq 1.0$ and $0.5 < w \leq 1.0$.

According to the first form of the invention, by optimizing the thickness of the first and second magnetic thin films, it becomes possible to more positively control the squareness ratio or the rise of an MR curve and heat resistance. If both the first and second magnetic thin films have an equal thickness as in most examples described in the above-cited references (a) to (e), then both the thin films have a squareness ratio closer to 1.0 as their thickness increases. This means that the magnetization curve contains no definite bend of magnetization. As a result, the MR curve starts rising at several tens of Oe, undesirably exhibiting poor linearity at zero magnetic field. Then the first and second magnetic thin films will exhibit better linearity or better rise when both are thin. However, if both are as thin as about 10 Å, for example, then a heat resistance problem arises. More particularly, when heated in vacuum at temperatures of about 350° C., the first magnetic thin film undergoes a substantial loss of squareness ratio while the second magnetic thin film undergoes little loss of squareness ratio. It is found that the first magnetic thin film will have a squareness ratio approximate to 1.0 when it is increased in thickness. Then by somewhat increasing the thickness of the first magnetic thin film independent of the second magnetic thin film, better MR properties are available after heat treatment. Heat resistance is improved while suppressing any deterioration of the squareness ratio of the first magnetic thin film after heat treatment. The situation somewhat differs if the heat resistant temperature is up to 250° C. as will be described in conjunction with the second form of the invention.

It is preferred that the squareness ratio of the second magnetic thin film divided by that of the first magnetic thin film, $SQ_2/SQ_1$ be from 0.3 to 1.0, especially from 0.3 to 0.8.

In addition to the limitation of squareness ratio, the first form of the present invention requires to control the thickness of magnetic thin films. It is essential to control the thickness of magnetic thin films to satisfy the relationship:

$4 \text{ Å} \leq t_2 < 30 \text{ Å}$, $20 \text{ Å} < t_1$, and $t_1 > t_2$, preferably $4 \text{ Å} \leq t_2 \leq 28 \text{ Å}$, $22 \text{ Å} \leq t_1 \geq 100 \text{ Å}$ and $t_1 1.05 t_2$ wherein the first magnetic thin film having a lower coercive force has a thickness $t_1$ and the second magnetic thin film having a higher coercive force has a thickness $t_2$. If $t_2$ exceeds 30 Å, then the second magnetic thin film has an increased squareness ratio, resulting in a loss of linearity and slow rise. With $t_2$ of less than 4 Å, it is impossible to form a continuous film. With $t_1$ of less than 20 Å, heat resistance is lost. The upper limit of $t_1$ is generally 200 Å, preferably 100 Å from the point of view of linearity. If $t_2 \geq t_1$, there result low heat resistance, a loss of linearity of MR change in zero magnetic field, and a reduced MR ratio.

By controlling the squareness ratio and thickness of the first and second magnetic thin films, a magnetic multilayer film as deposited exhibits an MR ratio as high as 5% or more, especially 6 to 10%, better linearity across zero magnetic field, and an increased MR slope. More specifically, the difference in MR ratio under an applied magnetic field of from −3 Oe to +3 Oe is 0.5% or more, typically about 0.5 to 1%, which is sufficient as reading MR heads for ultra-high density recording.

By controlling $t_1$ and $t_2$ as mentioned above, the present invention improves heat resistance so that deterioration of properties, especially an MR ratio by heat treatment is minimized. More specifically, after heat treatment in vacuum at 350° C. or lower, the MR ratio is maintained at 75% or more of that prior to heat treatment, that is, an MR ratio of at least 4.5%, especially at least 5% is obtained. Such heat treatment is encountered, for example, during an MR head manufacturing process. If a proper set of conditions is selected, the gradient across zero magnetic field as represented by the difference in MR ratio under an applied magnetic field between −3 Oe and +3 Oe will be rather improved, for example, from 25% decrease prior to heat treatment to 100% increase after heat treatment. A gradient of 0.5% or more, typically about 0.5 to 1%, which is sufficient as reading MR heads for ultra-high density recording can be obtained even after heat treatment. It is to be noted that after heat treatment, $SQ_1$ remains in the range of 0.7 to 1.0, especially 0.8 to 1.0 and $SQ_2$ remains in the range of 0.1 to 0.8, especially 0.3 to 0.8.

The non-magnetic thin films are formed of a material which plays the role of attenuating the magnetic interactions between magnetic thin films having different coercive forces. The non-magnetic material is not critical and may be selected from metallic and metalloid non-magnetic materials and non-metallic non-magnetic materials. Preferred examples of the metallic non-magnetic material include Au, Ag, Cu, Pt, Al, Mg, Mo, Zn, Nb, Ta, V, Hf, Sb, Zr, Ga, Ti, Sn and Pb and alloys thereof. More preferred are gold, silver, copper and alloys containing at least 70% by weight of one, two or three of gold, silver and copper. Examples of the metalloid non-magnetic material include Si, Ge, C, and B, which may optionally contain an additional element or elements. Examples of the non-metallic non-magnetic material include $SiO_2$, SiO, SiN, $Al_2O_3$, ZnO, MgO, and TiN, which may optionally contain an additional element or elements.

In the first form of the invention, the non-magnetic thin film should have a thickness $t_3$ of up to 200 Å. In general, with a film thickness in excess of 200 Å, the resistance largely depends on a non-magnetic thin film, leaving little margin for spin-dependent scattering and resulting in a reduced MR ratio. On the other hand, a non-magnetic thin film of a reduced thickness will allow greater magnetic interactions to develop between magnetic thin films, prohibiting both the magnetic thin films from exhibiting different magnetization directions, and it is difficult to form a continuous film of such a reduced thickness. For these reasons, a thickness of at least 4 Å is preferred.

Understandably, the thickness of magnetic thin films and non-magnetic thin films can be measured by means of a transmission electron microscope or scanning electron microscope or by Auger electron spectroscopy. The crystal structure of thin films can be observed by X-ray diffraction or high speed electron diffraction analysis.

In the second form of the invention, the thicknesses of the first and second magnetic thin films and the non-magnetic thin film are optimized in a different way from the first form. More particularly, both the first and second magnetic thin films are as thin as less than 20 Å. Irrespective of such significantly reduced thickness, the multilayer film is little affected by heating in vacuum at about 250° C. though the squareness ratio is somewhat deteriorated. The normal requirement of heat resistance is thus met. The squareness ratio approaches to 1.0 as the first magnetic thin film is increased in thickness. Therefore, a multilayer film having better MR properties after heat treatment is expected when the first magnetic thin film is somewhat increased in thickness independent of the second magnetic thin film.

The second form of the invention requires to control the respective film thicknesses to satisfy the relationship:

4 Å<$t_2$<20 Å, 5 Å<$t_1$<20 Å'(especially

5 Å<$t_1$<20 Å), $t_1$>$t_2$, and 32 Å<$t_3$<50 Å, preferably

6 Å≦$t_2$<18 Å, 6 Å<$t_1$≦18 Å, $t_1$≧1.05 $t_2$, and

36 Å≦$t_3$Å≦48 Å, wherein $t_1$, $t_2$ and $t_3$ are the thicknesses of the first magnetic thin film, second magnetic thin film, and non-magnetic thin film, respectively. A second thin film having $t_2$ in excess of 20 Å would have a higher squareness ratio so that the MR curve would lose linearity and have a slow rise.

By restricting $t_1$, $t_2$ and $t_3$ in the above range, there is obtained a magnetic multilayer film which as deposited exhibit a high MR ratio of at least 5%, especially 6 to 10% and an MR change having a linear, large gradient across zero magnetic field. More particularly, the magnetic multilayer film exhibits an MR slope of at least 0.15%/Oe, often about 0.2 to 0.5%/Oe under an applied magnetic field in the range between −50 Oe and +50 Oe. This property is sufficient for MR heads for reading ultrahigh-density recorded signals.

The restriction of $t_1$, $t_2$ and $t_3$ in the above range is also effective for providing thermal stability, thus minimizing deterioration of properties, especially MR ratio by heat treatment. More particularly, even after heat treatment at 250° C. or lower in vacuum or in air, the MR ratio is maintained at a level corresponding to at least 75% of that prior to the heat treatment, that is, an MR ratio of at least 4.5%, especially at least 5% is obtained after the heat treatment. Also after the heat treatment, $SQ_1$ maintains a value of 0.7 to 1.0, especially 0.8 to 1.0 and $SQ_2$ maintains a value of 0.1 to 0.8, especially 0.3 to 0.8.

The magnetic multilayer film in the second form is useful in practice since it exhibits an MR curve having a maximum hysteresis width of up to 10 Oe, often 1 to 6 Oe. In addition, the magnetic multilayer film exhibits an MR slope of at least 0.03%/Oe, often 0.05 to 0.5%/Oe in a magnetic field having a high frequency of 1 MHz. This property is sufficient for MR heads for reading ultrahigh-density recorded signals.

It is to be noted that the MR ratio is calculated as (ρmax −ρsat)ρsat×100% wherein ρmax is maximum resistivity and ρsat is minimum resistivity; the maximum hysteresis width is obtained by measuring MR to depict an MR curve over the magnetic field range between −50 Oe and +50 Oe and determining the maximum hysteresis width from the MR hysteresis loop; the MR slope is obtained by measuring an MR to depict an MR curve, determining a differential curve thereof, and determining a maximum differential value over the magnetic field range between −50 Oe and +50 Oe; and the high-frequency MR slope is obtained by measuring an MR ratio in an alternating magnetic field of 3 Oe at a frequency of 1 MHz and determining a gradient thereof between −3 Oe and +3 Oe.

The reported examples having thin Cu layers of less than 50 Å thick exhibit a small MR ratio of less than 3% or 4%, with the magnetic layers involved therein being as thick as about 30 Å. In contrast, by combining a non-magnetic thin film of less than 50 Å thick with magnetic thin films of less than 20 Å thick, the present invention provides a magnetic multilayer film exhibiting a linear MR change. Especially when the non-magnetic thin film has a thickness $t_3$ of from more than 32 Å to less than 50 Å, there is developed a linear MR curve across zero magnetic field. A non-magnetic thin film having a thickness $t_3$ in excess of 50 Å would completely interrupt magnetic coupling between the sandwiching layers, resulting in a narrow linear region which is inadequate as head properties. A non-magnetic thin film having a thickness $t_3$ of less than 32 Å would enhance magnetic coupling between the sandwiching layers, resulting in an MR curve rising at a point far offset from the zero magnetic field in the positive direction, that is, losing linearity.

The artificial superlattice magnetic multilayer film of the invention may have any desired repetitive number (n) of alternately stacked magnetic and non-magnetic thin films. The repetitive number (n) may be suitably selected in accordance with a desired MR ratio although n of 3 or more is preferred to provide a sufficient MR ratio. As the repetitive number (n) is increased, the MR ratio is also increased at the sacrifice of production yield. With a too large repetitive number (n), the element as a whole has a reduced resistance which is inconvenient for practical use. Then the repetitive number (n) is preferably up to 50. The long period superlattice structure can be observed by taking a small angle X-ray diffraction pattern where primary and secondary peaks corresponding to recurring periodicities appear.

Only two types of magnetic thin films having different coercive forces are used in the illustrated embodiment. Another embodiment using three or more types of magnetic thin films having different coercive forces has the advantage that there can be provided two or more external magnetic fields by which the magnetization direction is reversed, expanding the range of operating magnetic field intensity.

It is also effective to alleviate the difference in surface energy between the substrate material and the artificial superlattice-constituting material for improving wetting between them. In this regard, a thin film of a metal such as Cr, Fe, Co, Ni, W, Ti, V, and Mn or an alloy thereof may be formed to a thickness of about 10 to 100 Å as an undercoat layer underlying the magnetic multilayer film in order to establish a multilayer structure having a flat interface over a wider area. On the surface of the uppermost magnetic thin film, an anti-oxidation film of silicon nitride or silicon oxide may be formed and a metallic conductive layer may be formed for electrode tapping. The magnetic multilayer film can be formed by conventional methods such as evaporation, sputtering and molecular beam epitaxy (MBE) methods. Evaporation or MBE is carried out under a pressure of up to $10^{-8}$ Torr. The substrate may be of glass, silicon, magnesium oxide, gallium arsenide, ferrite and CaTiO.

Figure 3:
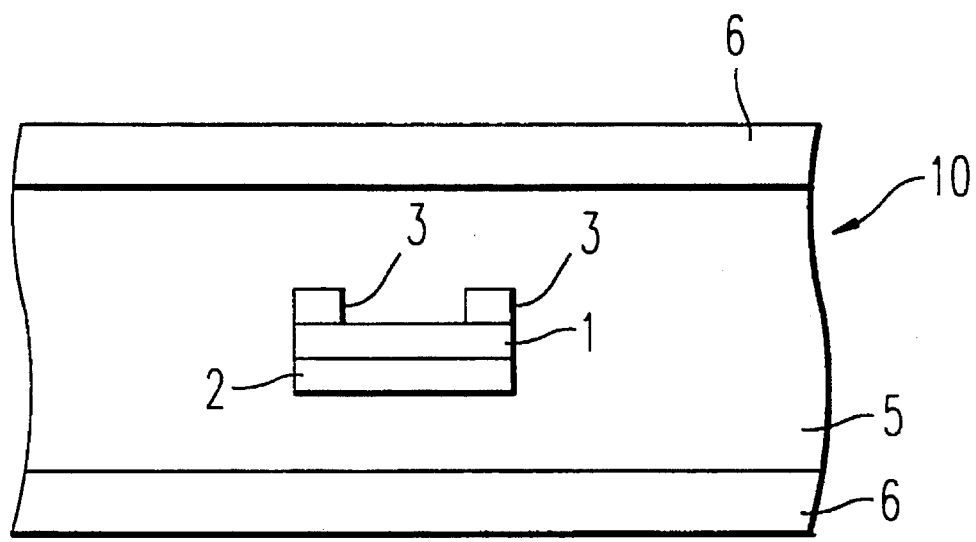
FIG. 3 is a schematic view of a magnetoresistance element according to one embodiment of the invention.
Figure 4:
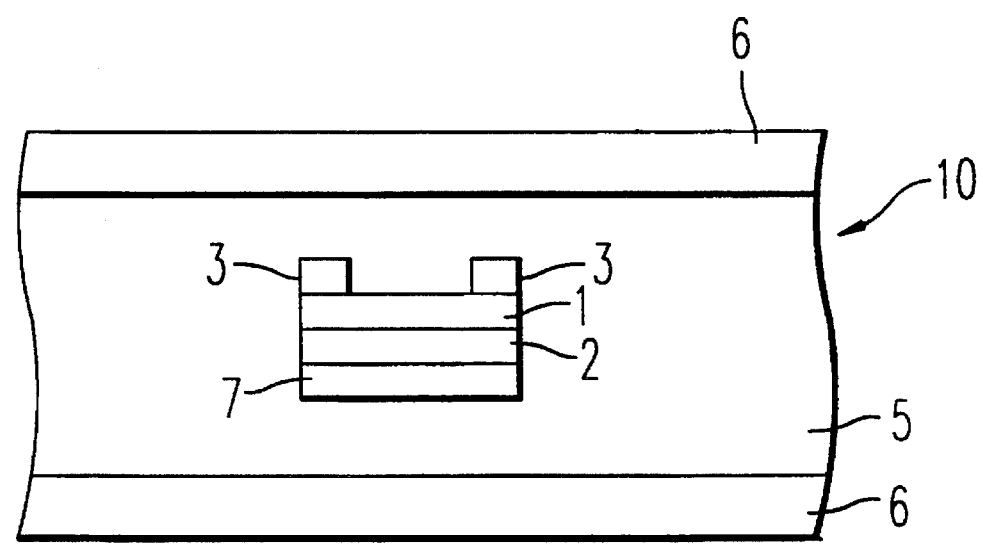
FIG. 4 is a schematic view of a magnetoresistance element according to another embodiment of the invention.

Referring to FIGS. 3 and 4, the magnetic multilayer film of the invention is shown as embodying magnetoresistance elements such as MR heads. Each of the magnetoresistance elements shown in FIGS. 3 and 4 includes a magnetic multilayer film 1 formed within an insulating layer 5. Electrodes 3 and 3 of Cu, Ag and Au, for example, are deposited on the magnetic multilayer film 1 for conducting measuring electric current across the film 1. A shunt layer 2 of Ti, for example, is joined to the lower surface of the film 1. The insulating layer 5 and hence the magnetic multilayer film 1 is sandwiched between shields 6 and 6 of Sendust or Permalloy. In the embodiment of FIG. 4, a layer 7 of high-resistivity soft magnetic material such as CoZrMo and NiFeRh is joined to the lower surface of the shunt layer 2 for applying a biasing magnetic field. It is to be noted that the biasing magnetic field applying means and shunt layer may be omitted because the magnetic multilayer film of the invention is characterized by a better zero field rise.

The process for the fabrication of magnetoresistance elements involves patterning and flattening steps which include heat treatments such as baking, annealing and resist curing. The magnetic multilayer film in the first form of the invention is well resistant against heat and tolerates heat treatment at temperatures of up to 500° C., often 50° to 400° C., typically 50° to 350° C. Such heat treatment may be carried out in vacuum, an inert gas atmosphere or air.

The magnetic multilayer film in the second form of the invention tolerates heat treatment at temperatures of up to 400° C., often 50° to 300° C., typically 50° to 250° C.

EXAMPLE

Examples of the present invention are given below by way of illustration and not by way of limitation.

EXAMPLE 1

A glass substrate (4 in FIG. 1) was placed in a ultra-high vacuum evaporation vessel which was evacuated to a vacuum of $10^{-9}$ to $10^{-10}$ Torr. While rotating the substrate at room temperature, a magnetic multilayer film (1 in FIG. 1) of the following composition was deposited on the substrate. Evaporation was carried out at a film growth rate of about 0.3 Å/sec. by an MBE method.

Table 1 shows the arrangement of magnetic and non-magnetic thin films in the multilayer film and a magnetoresistance ratio thereof. For example, sample No. 1 in Table 1 is $[Ni_{0.8}Fe_{0.2}(23)/Cu(50)/Co(10)/Cu(50)] \times 10$ which means that a procedure consisting of steps of successively depositing a first magnetic thin film of NiFe or Permalloy magnetic alloy (Ni80%-Fe20%) of 23 Å thick, a non-magnetic thin film of Cu of 50 Å thick, a second magnetic thin film of Co of 10 Å thick, and a non-magnetic thin film of Cu of 50 Å thick was repeated 10 times. Since the number of repeated deposition procedures was 10 for all the samples, each procedure or multilayer unit is expressed in Table 1 as (50, 10, 23) in the order of ($Cu/t_3$, $Co/t_2$, $NiFe/t_1$). In all the samples, a chromium layer of 50 Å thick was formed as an undercoat layer.

Magnetization and a B-H loop were measured by means of a vibrating sample magnetometer (VSM). Separately for resistance measurement, the sample was cut into a strip of 0.5 mm×10 mm, which was measured for resistance by a four terminal method. For measurement, electric current was longitudinally passed through the strip and an external magnetic field was applied in plane and perpendicular to the electric current and varied from −300 Oe to +300 Oe. From the resistance measurement, minimum resistivity $\rho_{sat}$ and a magnetoresistance (MR) ratio $\Delta\rho/\rho_{sat}$ were determined. The MR ratio $\Delta\rho_{sat}$ is calculated according to the equation:

$$\Delta\rho/\rho_{sat} = (\rho_{max} - \rho_{sat})/\rho_{sat} \times 100\%$$

wherein $\rho_{max}$ is the maximum resistivity. Further, a difference in MR ratio under an applied magnetic field of from −3 Oe to +30 Oe was measured and regarded as a zero field gradient for evaluating rise property. The value of zero field gradient must be 0.5% or more as previously mentioned.

Separately, a binary artificial superlattice was prepared using a first magnetic thin film (Co) or a second magnetic thin film (NiFe) and a non-magnetic thin film (Cu). This sample was also measured for squareness ratios $SQ_1$, $SQ_2$ and their ratio $SQ_2/SQ_1$.

The results (initial properties) are shown in Table 1.

TABLE 1

| Sample No. | Multilayer film thickness (Cu, Co/$t_2$, NiFe/$t_1$) | ρ sat (μΩ·cm) | MR ratio (%) | Squareness ratio | | | Zero field gradient (%) |
|---|---|---|---|---|---|---|---|
| | | | | $SQ_1$ | $SQ_2$ | $SQ_2/SQ_1$ | |
| 1 | (50, 10, 23) | 9.746 | 7.5 | 0.90 | 0.55 | 0.61 | 0.75 |
| 2 | (50, 10, 32) | 10.850 | 6.2 | 0.94 | 0.55 | 0.59 | 0.62 |
| 3 | (50, 15, 30) | 9.822 | 7.9 | 0.93 | 0.61 | 0.66 | 0.96 |
| 4 | (50, 20, 50) | 9.958 | 5.9 | 0.96 | 0.68 | 0.71 | 0.58 |
| 5 | (60, 20, 30) | 8.438 | 6.1 | 0.93 | 0.68 | 0.73 | 0.82 |
| 6 | (40, 15, 25) | 8.921 | 7.8 | 0.93 | 0.61 | 0.66 | 0.61 |
| 7 (comparison) | (50, 10, 10) | 9.711 | 5.1 | 0.60 | 0.55 | 0.92 | 1.64 |
| 8 (comparison) | (50, 15, 15) | 9.930 | 7.5 | 0.85 | 0.73 | 0.86 | 0.67 |
| 9 (comparison) | (50, 20, 20) | 9.577 | 7.7 | 0.88 | 0.78 | 0.89 | 0.55 |
| 10 (comparison) | (50, 30, 30) | 10.792 | 6.6 | 0.93 | 0.85 | 0.91 | 0.13 |
| 11 (comparison) | (50, 40, 40) | 10.893 | 5.4 | 0.94 | 0.91 | 0.97 | 0.10 |
| 12 (comparison) | (50, 15, 10) | 9.419 | 5.1 | 0.60 | 0.73 | 1.22 | 1.02 |
| 13 (comparison) | (60, 20, 20) | 8.595 | 6.6 | 0.90 | 0.62 | 0.69 | 0.73 |
| 14 (comparison) | (40, 20, 20) | 8.595 | 6.6 | 0.97 | 0.90 | 0.93 | 0.23 |

The samples were heat treated in vacuum at 350° C. for 2 hours. Table 2 reports the squareness ratio, $\rho_{sat}$, MR ratio, and zero field gradient of the heat treated samples together with their changes from the initial ones.

TABLE 2

| | Heat treated at 350° C. for 2 hours | | | | | | |
|---|---|---|---|---|---|---|---|
| Sample No. | Squareness ratio | | ρ sat (μΩ·cm) | MR ratio | | Zero field gradient | |
| | $SQ_1$ | $SQ_2$ | | (%) | change (%) | (%) | change (%) |
| 1 | 0.88 | 0.56 | 10.470 | 5.6 | −25 | 0.85 | +13 |
| 2 | 0.91 | 0.56 | 11.909 | 5.4 | −13 | 0.76 | +23 |
| 3 | 0.90 | 0.60 | 10.902 | 5.9 | −25 | 0.88 | −8 |
| 4 | 0.95 | 0.65 | 11.321 | 5.5 | −7 | 0.60 | +3 |
| 5 | 0.90 | 0.65 | 10.621 | 5.3 | −13 | 0.79 | −4 |
| 6 | 0.89 | 0.60 | 10.729 | 5.9 | −24 | 0.71 | +16 |
| 7 (comparison) | | | 10.396 | 2.6 | −49 | 0.08 | −95 |
| 8 (comparison) | | | 10.532 | 4.7 | −37 | 0.12 | −82 |
| 9 (comparison) | | | 11.114 | 4.3 | −44 | 0.21 | −62 |
| 10 (comparison) | | | 11.667 | 4.6 | −30 | 0.16 | +23 |
| 11 (comparison) | | | 11.738 | 4.1 | −24 | 0.09 | −10 |
| 12 (comparison) | | | 9.419 | 1.8 | −65 | 0.08 | −92 |
| 13 (comparison) | | | 9.371 | 3.2 | −52 | 0.31 | −58 |
| 14 (comparison) | | | 9.426 | 3.3 | −50 | 0.16 | −30 |

As is evident from the data of Table 2, only sample Nos. 1 to 6 within the scope of the invention provide a zero field gradient of more than 0.5% and an MR ratio of more than 5% both at the initial and after the heat treatment.

Figure 5A:
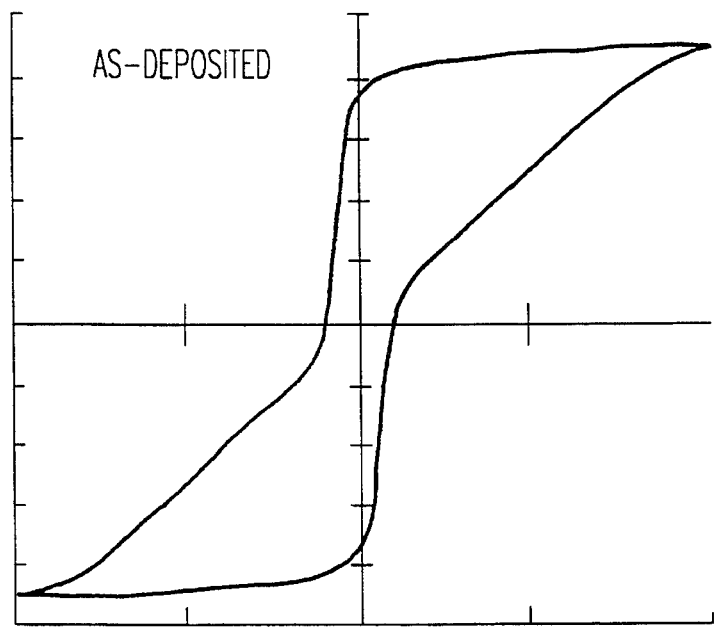
FIG. 5 shows a M-H loop of as-deposited and heat treated sample No. 3.
Figure 5B:
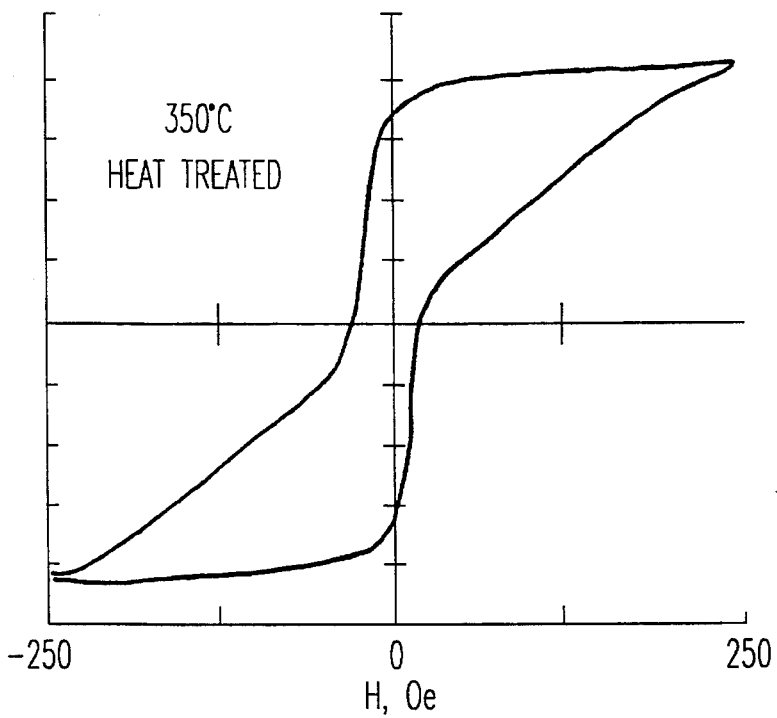

FIG. 5 shows a M-H loop of as-deposited and heat treated sample No. 3.

FIG. 6 shows MR curves of as-deposited and heat treated sample No. 3. FIG. 7 shows MR curves of as-deposited and heat treated comparative sample No. 7.

Figure 8A:
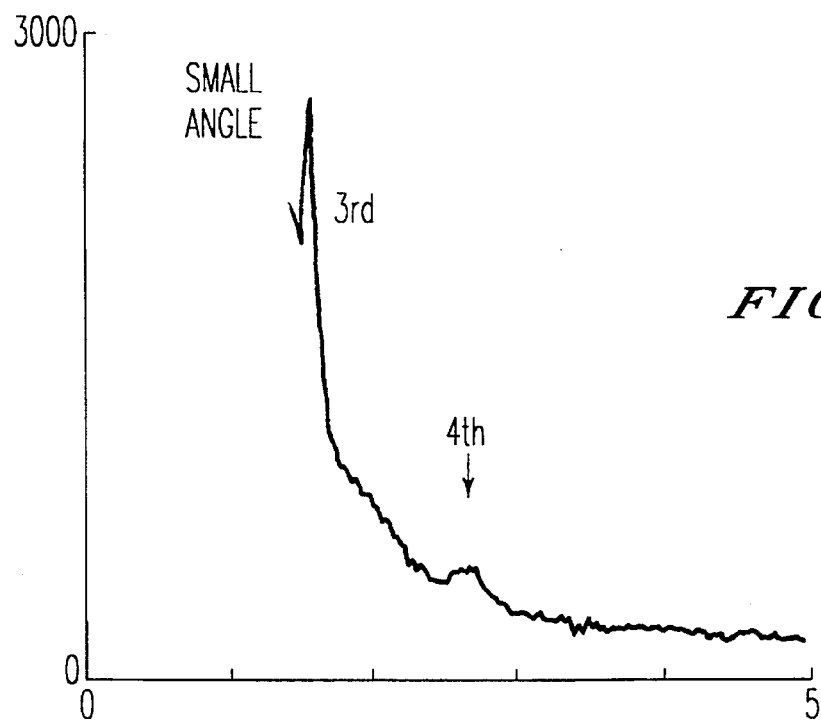
FIGS. 8 and 9 are X-ray diffraction patterns of as-deposited and heat treated sample No. 1, respectively.
Figure 8B:
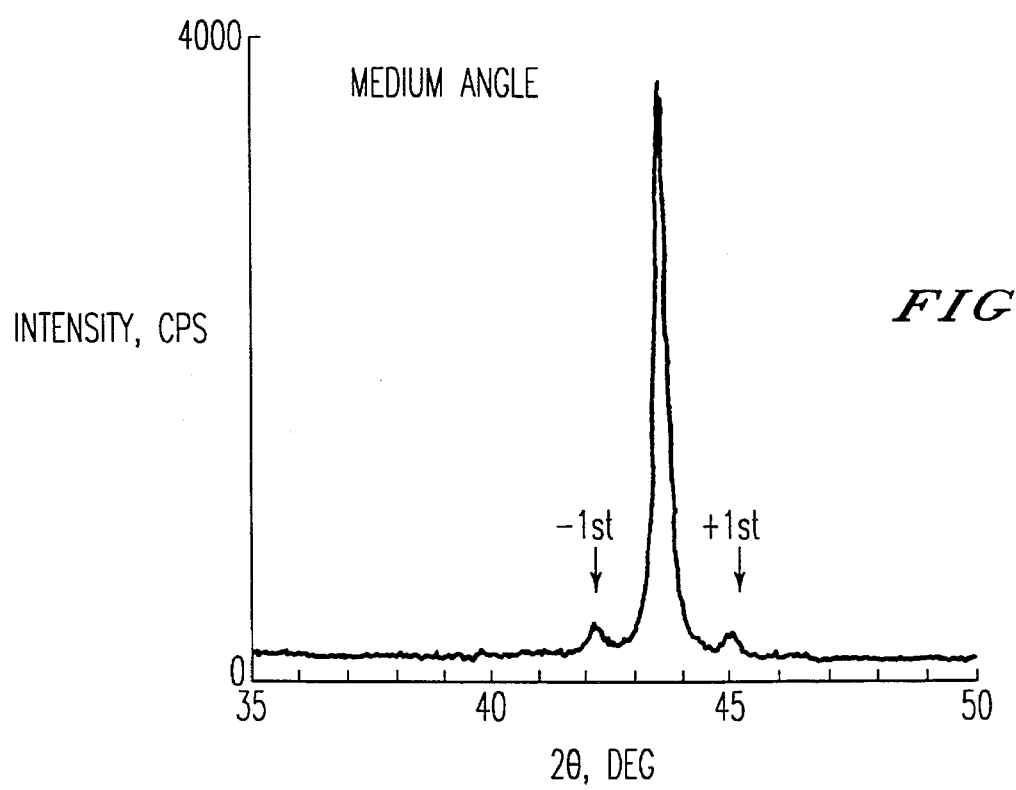
Figure 9:
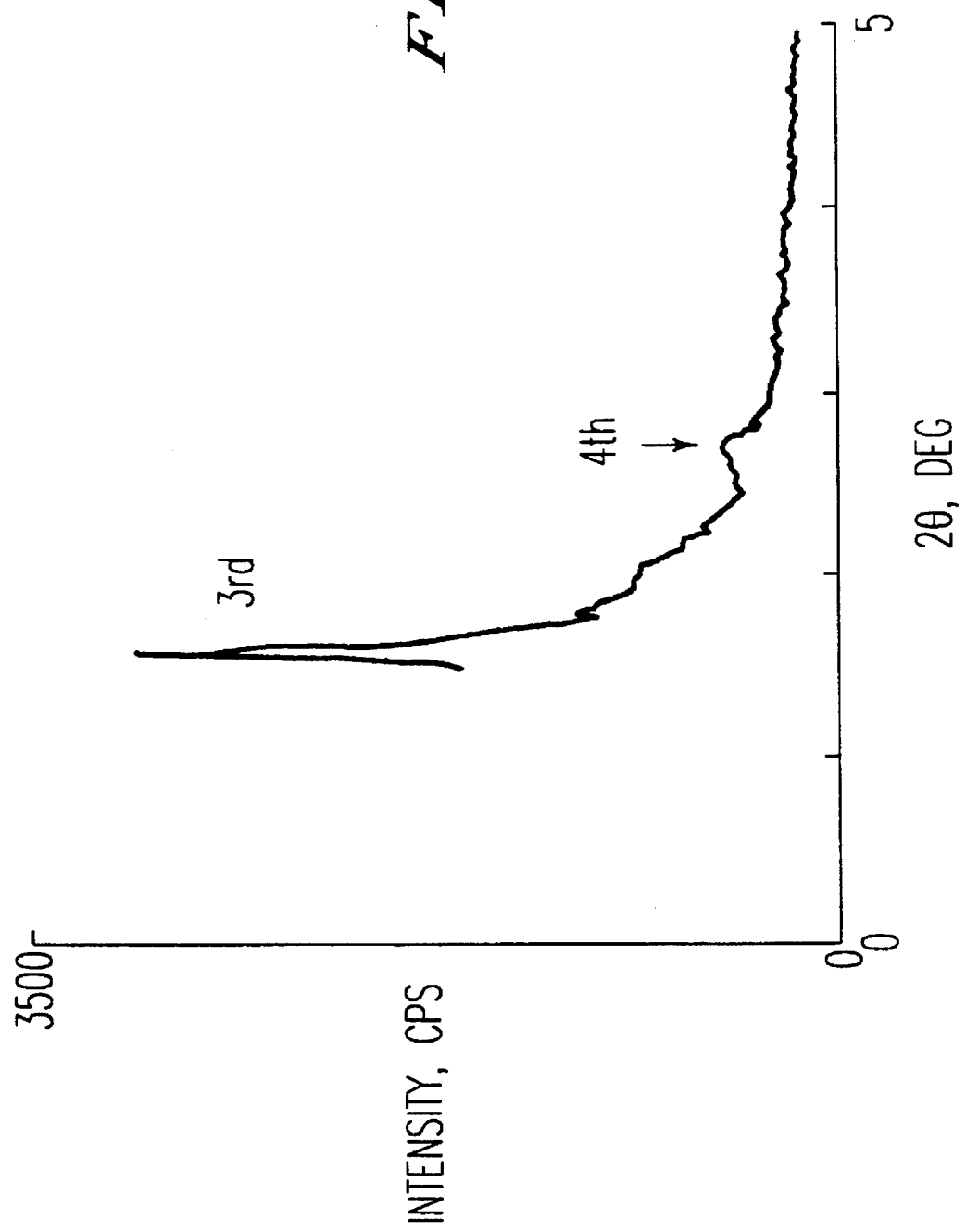

FIGS. 8 and 9 are X-ray diffraction patterns of as-deposited and heat treated sample No. 1, respectively.

It is seen from these figures that the samples within the scope of the invention maintain a long periodicity lattice structure both as deposited and after heat treatment.

In the first form of the invention, the magnetic multilayer film has a great magnetoresistance ratio of several percents to several tens of percents under a relatively weak external magnetic field of several oersted to several tens of oersted. It shows an excellent rise at zero magnetic field and has very high heat resistance. There are obtained improved MR elements as typified by high sensitivity MR sensors and MR heads capable of high density magnetic recording.

Example 2

Following the procedure of Example 1, samples as shown in Table 3 were fabricated.

As in Example 1, magnetization and a B-H loop were measured by means of a VSM. Separately for resistance measurement, the sample of Table 3 was cut into a strip of 0.5 mm×10 mm, which was measured for resistance by a four terminal method. For measurement, electric current was longitudinally passed through the strip and an external magnetic field was applied in plane and perpendicular to the electric current and varied from −300 Oe to +300 Oe. From the resistance measurement, minimum resistivity $\rho_{sat}$ and an MR ratio $\Delta\rho/\rho_{sat}$ were determined. Further, an MR slope was measured under an applied magnetic field in the range between −50 Oe and +50 Oe. The MR slope must be 0.15%/Oe or more as previously mentioned. Also determined were the maximum hysteresis width and a high-frequency MR slope in an alternating magnetic field within an intensity of ±3 Oe and at a high frequency of 1 MHz.

The results are also shown in Table 3.

TABLE 3

| Sample No. | (Cu, Co, NiFe) ($t_3$, $t_2$, $t_1$) | $\rho_s$ ($\mu\Omega$ cm) | MR (%) | Squareness ratio SQ$_1$ | SQ$_2$ | SQ$_2$/SQ$_1$ | MR Slope (%/Oe) | Hysteresis (Oe) | High-frequency Slope (%/Oe) |
|---|---|---|---|---|---|---|---|---|---|
| 21 | (45, 10, 13) | 9.051 | 7.0 | 0.82 | 0.55 | 0.67 | 0.23 | 4.9 | 0.06 |
| 22 | (40, 11, 13) | 9.323 | 6.7 | 0.82 | 0.57 | 0.70 | 0.22 | 4.5 | 0.05 |
| 23 | (48, 10, 18) | 9.256 | 7.2 | 0.89 | 0.55 | 0.62 | 0.27 | 5.5 | 0.07 |
| 24 | (35, 12, 14) | 9.876 | 5.8 | 0.84 | 0.58 | 0.69 | 0.20 | 5.2 | 0.05 |
| 25 (Comparison) | (50, 10, 10) | 9.184 | 5.1 | 0.60 | 0.55 | 0.92 | 0.28 | 0.5 | 0.01 |
| 26 (Comparison) | (30, 10, 15) | 10.298 | 4.2 | 0.80 | 0.55 | 0.69 | 0.18 | 6.0 | 0.02 |
| 27 (Comparison) | (50, 10, 15) | 9.263 | 6.2 | 0.80 | 0.60 | 0.75 | 0.41 | 6.2 | 0.02 |
| 28 (Comparison) | (50, 30, 30) | 10.792 | 6.6 | 0.93 | 0.85 | 0.91 | 0.11 | 12.0 | 0.01 |
| 29 (Comparison) | (50, 16, 10) | 9.435 | 4.8 | 0.60 | 0.71 | 1.18 | 0.16 | 1.3 | 0.01 |

As seen from the data of Table 3, the magnetic multilayer films according to the second form of the invention have a great MR ratio, a great MR slope, a great high-frequency MR slope, and a reduced hysteresis width.

Figure 10:
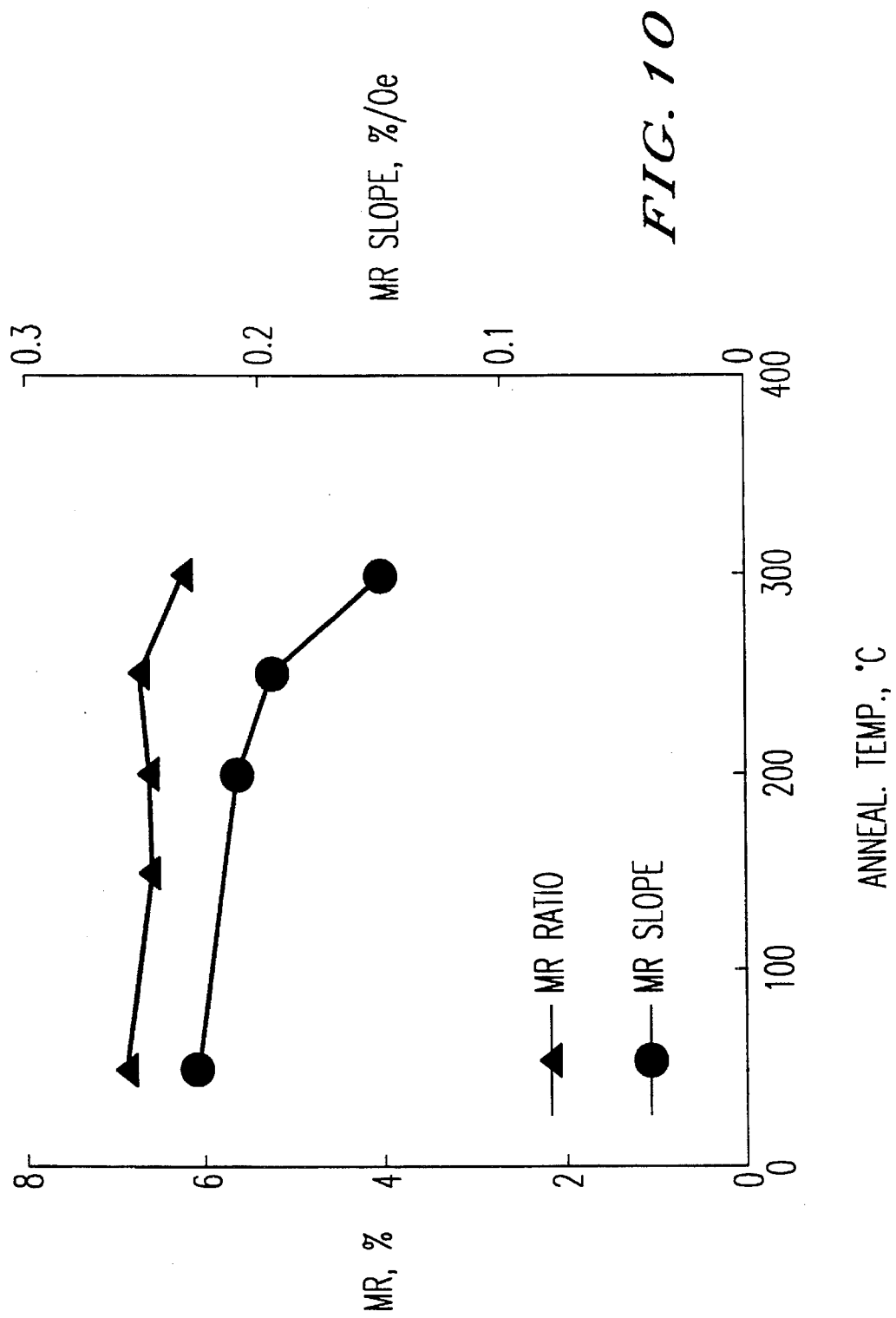
FIG. 10 is a graph showing MR ratio and MR slope relative to annealing temperature.

FIG. 10 plots the MR ratio (%) and MR slope (%/Oe) versus annealing temperature of sample No. 22 which was annealed at the indicated temperature in vacuum ($10^{-7}$ Torr) for one hour. It is evident that the inventive samples are fully heat resistant.

In the second form of the invention, the magnetic multilayer film has great MR ratio, a great MR slope over the magnetic field range between $-50$ and $+50$ Oe, high magnetic field sensitivity and minimized hysteresis. It also shows high detection sensitivity in a high-frequency magnetic field and good heat resistance. There are obtained improved MR elements as typified by high sensitivity MR sensors and MR heads capable of high density magnetic recording without bias magnetic field applying mechanism.

We claim:

1. A magnetic multilayer film, comprising a first and a second magnetic thin film with a non-magnetic thin film between said first and second magnetic thin films, wherein
    said first and second magnetic thin films have different coercive forces, said first magnetic thin film having a lower coercive force and a squareness ratio SQ$_1$ of from 0.7 to 1.0 and said second magnetic thin film having a higher coercive force and a squareness ratio SQ$_2$ of from 0.1 to 0.8;
    the first magnetic thin film has a thickness $t_1$, the second magnetic thin film has a thickness $t_2$ and the non-magnetic thin film has a thickness $t_3$ wherein 4 Å$\leq t_2 <$30 Å 20 Å$<t_1<$200 Å, $t_1>t_2$ and 4 Å$<t_3<$60 Å, and
    wherein the ratio of coercive force between adjacent magnetic thin films is 1.2:1 to 100:1.

2. The magnetic multilayer film of claim 1 wherein SQ$_2$/SQ$_1$ is from 0.3 to 1.0.

3. The magnetic multilayer film of claim 1 wherein 4 Å$\leq t_2 \leq$28 Å, $>$Å$\leq t_1$, and $t_1 \geq 1.05t_2$.

4. A magnetic multilayer film as set forth in any one of claims 1 to 3, which is prepared by a method comprising the steps of:
    depositing the first and second magnetic thin films while interposing the non-magnetic thin film therebetween and
    effecting heat treatment at a temperature of up to 500° C.

5. A magnetic mulitlayer film, comprising a first and a second magnetic thin film with a non-magnetic thin film between said first and second magnetic thin films, wherein
    said first magnetic thin film having a lower coercive force has a thickness $t_1$, said second magnetic thin film having a higher coercive force has a thickness $t_2$, and said non-magnetic thin film has a thickness $t_3$, which fall in the range: 4 Å$<t_2<$20 Å, 5 Å$<t_1 \leq$20 Å, $t_1>t_2$, and 32 Å$<t_3<$50 Å, and
    wherein a ratio of coercive force between adjacent magnetic thin film is 1.2:1 to 100:1.

6. The magnetic multilayer film of claim 5 wherein said first magnetic thin film has a squareness ratio SQ$_1$ of from 0.7 to 1.0, and said second magnetic thin film has a squareness ratio SQ$_2$ of from 0.1 to 0.8.

7. The magnetic multilayer film of claim 6 wherein SQ$_2$/SQ$_1$ is from 0.3 to 1.0.

8. The magnetic multilayer film of claim 5 wherein $t_1<20$ Å.

9. The magnetic multilayer film of claim 5 wherein 6 Å$23 t_2$, $t_1 \leq$18 Å, $t_1 \geq 1.05t_2$, and 36 Å$\leq t_3 \leq$48 Å.

10. The magnetic multilayer film of claim 5 which produces a magnetoresistive curve having a maximum hysteresis width of up to 10 Oe.

11. The magnetic multilayer film of claim 5 which produces a magnetoresistive curve having a magnetoresistant slope of at least 0.15%/Oe in the magnetic field range between $-50$ Oe and $+50$ Oe.

12. The magnetic multilayer film of claim 5 having a magnetoresistance ratio of a least 5%, said magnetoresistance ratio being defined as (maximum resistivity—minimum resistivity)/(minimum resistivity)×100%.

13. The magnetic multilayer film of claim 5 which produces a magnetoresistive curve having a magnetoresistant slope of at least 0.03%/Oe in a magnetic field with a high frequency of 1 MHz.

14. A magnetic mulitlayer film, comprising a first and a second magnetic thin film with a non-magnetic thin film between said first and second magnetic thin films, wherein
    said first magnetic thin film having a lower coercive force has a thickness $t_1$, said second magnetic thin film having a higher coercive force has a thickness $t_2$, and said non-magnetic thin film has a thickness $t_3$, which fall in the range: 4 Å$<t_2<$20 Å, 5 Å$<t_{1<20}$ Å, $t_1>t_2$, and 32 Å$<t_3<$50 Å, and
    wherein a ratio of coercive force between adjacent magnetic thin film is 1.2:1 to 100:1, and
    said first magnetic thin film has a composition (Ni$_x$Fe$_{1-x}$)$_y$Co$_{1-y}$ wherein $0.7 \leq x \leq 0.9$ and $0.5 \leq y \leq 1.0$.

15. magnetic mulitlayer film comprising a first and a second magnetic thin film with a non-magnetic thin film between said first and second magnetic thin films, wherein
    said first magnetic thin film having a lower coercive force has a thickness $t_1$, said second magnetic thin film having a higher coercive force has a thickness $t_2$, and said non-magnetic thin film has a thickness $t_3$, which fall in the range: $4\text{ Å}<t_2<20\text{ Å}$, $5\text{ Å}<t_1\leq 20\text{ Å}$, $t_1\geq t_2$, and $32\text{ Å}<t_3<50\text{ Å}$, and wherein a ratio of coercive force between adjacent magnetic thin film is 1.2:1 to 100:1, and said second magnetic thin film has a composition $(Co_zNi_{1-z})_wFe_{1-w}$ wherein $0.4\leq z\leq 1.0$ and $0.5\leq w\leq 1.0$.

16. The magnetic multilayer film of claim 5 wherein said non-magnetic thin film is formed of a member selected from the group consisting of silver, gold, copper and alloys containing at least 70% by weight of at least one of these metals.

17. A magnetic multilayer film as set forth in any one of claims 5 to 15, which is prepared by a method comprising the steps of:

depositing the first and second magnetic thin films while interposing the non-magnetic thin film therebetween and effecting heat treatment at a temperature of up to 400° C.

18. The magnetic multilayer film of claim 17 wherein the deposition step is carried out under a pressure of up to $10^{-8}$ Torr.

19. The magnetic multilayer film of claim 1, 2, 3, 5, 6, 7, 8, 9, 10, 11, 12, 13, 14 or 15, further comprising a substrate.

20. The magnetic multilayer film of claim 19, wherein said magnetic multilayer film does not have means for applying a biasing magnetic field.

\* \* \* \* \*

UNITED STATES PATENT AND TRADEMARK OFFICE
CERTIFICATE OF CORRECTION

PATENT NO. : 5,510,172
DATED : April 23, 1996
INVENTOR(S) : Satoru Araki et al

It is certified that error appears in the above-indentified patent and that said Letters Patent is hereby corrected as shown below:

Column 15, line 47, "30 Å 20 Å $<t_1$ <200 Å," should read --30 Å, 20 Å $< t_1 \leq$ 200 Å,--; and line 54, "> Å $\leq t_1$" should read --22 Å $\leq t_1$--.

Column 16, lines 30-31, "6 Å 23 $t_2$" should read --6 Å $\leq t_2$--;

line 54, "5 Å $< t_{1 < 20 Å}$" should read --5 Å $< t_1 <$ 20 Å--; and line 61, "magnetic" should read --A magnetic--.

Signed and Sealed this

Thirteenth Day of August, 1996

Attest:

BRUCE LEHMAN

*Attesting Officer*   *Commissioner of Patents and Trademarks*